US006822295B2

(12) United States Patent
Larson

(10) Patent No.: US 6,822,295 B2
(45) Date of Patent: Nov. 23, 2004

(54) OVERVOLTAGE PROTECTION DEVICE USING PIN DIODES

(75) Inventor: William Larson, Eden Prairie, MN (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 10/208,400

(22) Filed: Jul. 30, 2002

(65) Prior Publication Data

US 2004/0021178 A1 Feb. 5, 2004

(51) Int. Cl.[7] ............................................. H01L 23/62
(52) U.S. Cl. .............. 257/355; 361/91.5; 361/FOR 100
(58) Field of Search ....................... 361/91.5, FOR 100

(56) References Cited

U.S. PATENT DOCUMENTS

| | | | |
|---|---|---|---|
| 5,301,081 A | 4/1994 | Podell et al. .................. 361/56 |
| 5,563,757 A | 10/1996 | Corsi .......................... 361/56 |
| 5,600,525 A | 2/1997 | Avery .......................... 361/56 |
| 5,973,897 A | 10/1999 | Opris et al. .................... 361/56 |
| 6,031,704 A | 2/2000 | Jeong .......................... 361/111 |
| 6,111,734 A | 8/2000 | Harrington et al. ........... 361/56 |
| 6,114,226 A | 9/2000 | Chang et al. ................ 438/510 |
| 6,177,298 B1 | 1/2001 | Quigley ....................... 438/135 |
| 6,229,181 B1 | 5/2001 | Kravtchenko et al. ....... 257/355 |
| 6,317,305 B1 | 11/2001 | Dedic .......................... 351/56 |

OTHER PUBLICATIONS

EP 148577: Skanadore, William R., Overvoltage Protection Device, date of filing: Nov. 13, 1983, pp. 1–20.*
C. Duvvury, "ESD Protection Device Issues for IC Designs," IEEE 2001 Customs Integrated Circuits Conference Proceedings pp. 41–48.
R. Rountree "ESD Protection for Submicron CMOS Circuits—Issues and Solutions" 1988 IEDM Proceedings, pp. 580–583.
C. Richief et al, "Investigation of Different ESD Protection Strategies Devoted to 3.3V RF Application (2Ghz) in a 0.18 $\mu$m CMOS Process," EOS/ESD Symposium pp251–259.
Semtech SR3.3 Railclamp® product description 2000.

* cited by examiner

*Primary Examiner*—David Nelms
*Assistant Examiner*—Mai-Huong Tran
(74) *Attorney, Agent, or Firm*—McDonnell Boehnen Hulbert & Berghoff LLP

(57) ABSTRACT

A device and method of manufacture for a low capacitance overvoltage protection device. This is accomplished through the use of PiN diodes to shunt overvoltage away from internal circuit elements. PiN diodes are useful because they exhibit a low capacitance in reverse bias mode. Radio frequency integrated circuits and other integrated circuits operated at high frequency are sensitive to capacitance. This invention protects against circuit damage due to overvoltage events while keeping capacitance low through the use of PiN diodes.

20 Claims, 3 Drawing Sheets

OVERVOLTAGE PROTECTION DEVICE USING PIN DIODES

BACKGROUND OF THE INVENTION

1. Field of the Invention

The invention relates generally to the field of overvoltage protection devices for electronic circuitry and more particularly to a device and method of fabricating overvoltage protection devices using PiN diodes.

2. Discussion of Related Art

Overvoltage protection devices are often used in conjunction with integrated circuits because excessive overvoltage can destroy or impair elements of an integrated circuit. For example, an overvoltage event may cause a metal melt, junction breakdown or oxide failure. Overvoltage events can also lead to latent defects in an integrated circuit that may shorten the lifespan or substantially lessen the performance of an integrated circuit. The goal of overvoltage protection devices is to prevent damage to the integrated circuit when an overvoltage event occurs. Electrostatic discharge (ESD) is a major source of overvoltage events. ESD is usually caused by one of three events: direct electrostatic discharge to the device, electrostatic discharge from the device, or field-induced discharges. The likelihood of damage due to ESD is a function of the device's ability to dissipate the energy of the discharge or withstand the voltage levels involved. This is known as the device's "ESD sensitivity."

Conventional integrated circuit overvoltage protection devices utilize Zener diodes, PN diodes, gate grounded MOSFETS or SCR devices to substantially isolate integrated circuits from overvoltage events. These devices have been successfully employed in traditional integrated circuits to limit damage due to overvoltage.

Radio frequency (RF) integrated circuits (operating in the approximate range of 900 MHz to 5.8 GHz) and other high frequency integrated circuits present a particular challenge. Conventional integrated circuit overvoltage protection devices are unsuitable because their large input capacitance acts roughly as a high-pass filter. High frequency signals are sensitive to the capacitance of overvoltage protection devices. A higher frequency signal requires a lower input capacitance from the overvoltage protection device.

SCR devices were thought to be promising for RF applications because of their high ESD performance per micron. However, the capacitance of SCR devices, measured at 150 fF, however, is still too high for acceptable use in RF applications. Zener diodes, PN diodes and other conventional forms of ESD protection have all failed to produce reverse bias capacitance that are sufficient for use in RF integrated circuits.

SUMMARY OF THE INVENTION

In accordance with one embodiment, an overvoltage protection device operates by shunting an overvoltage event through a number of PiN diodes away from a signal node of an integrated circuit. Within a specified voltage range, the PiN diodes are in a reversed biased mode. If the voltage moves outside the specified voltage range, some or all of the PiN diodes switch from reverse bias mode to a forward biased mode to shunt the undesired and potentially harmful voltage away from an internal circuitry node. The overvoltage protection device is useful to protect radio frequency (RF) integrated circuits and other high frequency integrated circuits because the input capacitance of the PiN diodes in reverse bias mode is approximately 0.2 femtoFarads (fF) per micron of diode periphery. This low capacitance allows high frequency signals to pass through the overvoltage protection device without significant signal attenuation or signal degradation.

In one illustrative embodiment, one or more positive voltage PiN diodes are arranged such that in forward bias a highly positive voltage event will be shunted to a positive voltage source. One or more negative voltage PiN diodes are also arranged such that in forward bias mode a highly negative voltage event will be shunted to a negative voltage source. A Zener diode may be placed between the positive voltage source and negative voltage source whereby a highly positive voltage event would "breakdown" the Zener diode. Upon "breakdown" of the Zener diode, the highly positive voltage event would be further shunted to the negative voltage source. By serving as a ground, the negative voltage source would act to dissipate the highly positive voltage event.

In another illustrative embodiment, the overvoltage protection device is fabricated on a silicon-on-insulator (SOI) wafer. The process of manufacturing PiN diodes on a SOI wafer is a subset of the process of manufacturing CMOS transistors on a SOI wafer. Thus, the overvoltage protection device can be implemented on the same SOI wafer as the RF integrated circuit without additional manufacturing costs.

BRIEF DESCRIPTION OF THE DRAWINGS

The accompanying drawings are included to provide a further understanding of the invention. The drawings present illustrative embodiments of the invention and, together with the description, serve to explain the principles of the invention.

DETAILED DESCRIPTION OF THE INVENTION

Description of the Circuit Layout

Figure 1:
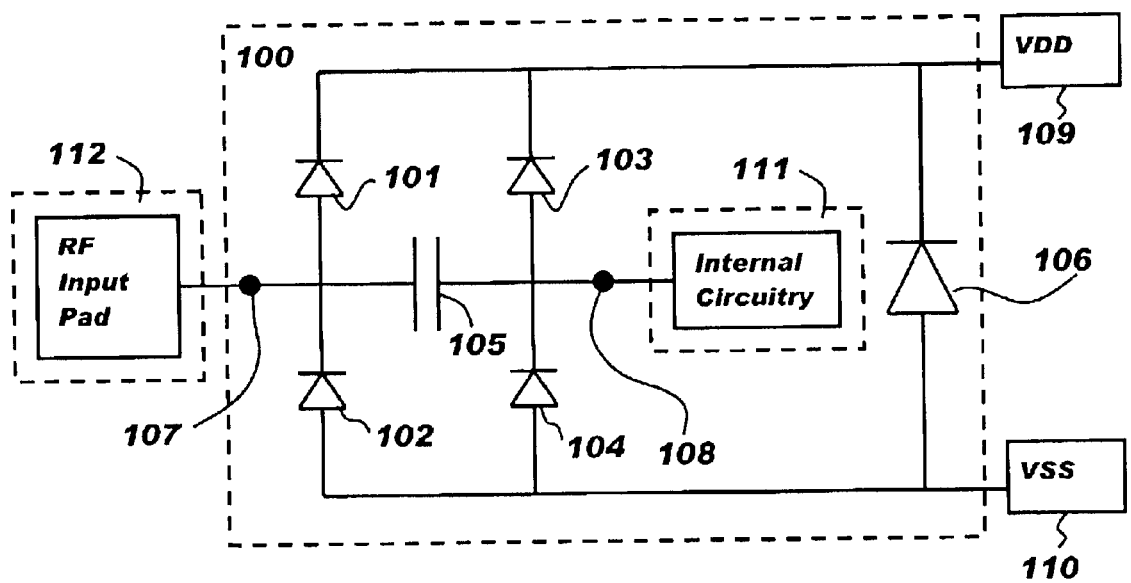
FIG. 1 is a schematic diagram of a preferred embodiment of an overvoltage protection device.

Referring first to FIG. 1, a preferred embodiment of the present invention an overvoltage protection device 100 is comprises a first positive voltage PiN diode 101, a second positive voltage PiN diode 103, a first negative voltage PiN diode 102, a second negative voltage PiN diode 104, a capacitor 105, a Zener diode 106, a signal node 107 and an internal circuitry node 108.

A primary signal line electrically interconnects the signal node 107 to the internal circuitry node 108 through the capacitor 105. Two elements that are electrically interconnected have an electric path that either directly or indirectly connects the two devices. An indirectly connected electric path may pass through one or more elements such as a diode, resistor or capacitor, inductor or the like before reaching its destination. The PiN diodes 101, 102, 103, 104 branch laterally from said primary signal line and act to substantially shunt an overvoltage event away from said primary signal line before damage occurs to an internal circuitry 111.

The positive voltage PiN diodes 101, 103 can be physically similar to the negative voltage PiN diodes 102, 104. A difference between the two types of diode is their orientation in the overvoltage protection device 100. The first positive PiN diode 101 is electrically connected to the signal node 107 and to a positive voltage source 109. The first positive PiN diode 101 is oriented to have its forward direction from the signal node 107 to the positive voltage source 109. The second positive PiN diode 103 is electrically connected to the internal circuitry node 108 and to the positive voltage source 109. The second positive PiN diode 103 is oriented to have its forward direction from the internal circuitry node 108 to the positive voltage source 109. The first negative PiN diode 102 is electrically connected to a negative voltage source 110 and to the signal node 107. The first negative PiN diode 102 is oriented to have its forward direction from the negative voltage source 110 to the signal node 107. The second negative PiN diode 104 is electrically connected to the negative voltage source 110 and to the internal circuitry node 108. The second negative PiN diode 104 is oriented to have its forward direction from said negative voltage source 110 to said internal circuitry node 108.

The Zener diode 106 is connected between the positive voltage source 109 and the negative voltage source 110. A highly positive voltage event at the positive voltage source 109 will cause the Zener diode 106 to "breakdown" and allow a reverse current to pass from the positive voltage source 109 to the negative voltage source 110.

The overvoltage protection device 100 can be connected to an RF input pad 112 at the signal node 107. The RF input pad 112 can receive and convey an RF signal voltage. Similarly, an internal circuitry 111 can be connected to the overvoltage protection device 100 at the internal circuitry node 108. The RF input pad 112 is electrically interconnected to the internal circuitry 111 through the overvoltage protection device. The overvoltage protection device 100 serves to protect said internal circuitry 111 from overvoltage events traveling between the internal circuitry and the RF input pad 112.

Flow of Current During an Overvoltage Event

The operation of the overvoltage protection device 100 is described next. Within a predetermined range of voltages, the PiN diodes 101, 102, 103,104 will each be in a reverse bias mode. A highly positive voltage event at the signal node will cause the first positive voltage PiN diode 101 to switch from reverse bias mode to a forward bias mode resulting in most of the current flowing through the first positive voltage PiN diode 101. A smaller portion of the voltage will pass through the capacitor 105 and may cause the second positive voltage PiN diode 103 to switch from reverse bias mode to a forward bias mode resulting in a significant portion of the remaining current flowing through the second positive voltage PiN diode 103. Depending upon the magnitude of the highly positive voltage event, the relative size of the positive PiN diodes 101, 103, the rise time of the highly positive voltage event, the amount of the highly positive voltage event that was shunted by the first positive voltage PiN diode 103 and other affecting criteria, the second positive voltage PiN diode 103 may or may not switch to a forward bias mode during a highly positive voltage event. A highly positive voltage at the positive voltage source 109 created by the flow of current through the positive voltage PiN diodes 101 or 103 may cause the Zener diode 106 to "breakdown" and further shunt the positive voltage to the negative voltage source 110. The Zener diode 106 will breakdown when the voltage difference across its terminals is greater than a breakdown voltage of the Zener diode 106. The breakdown voltage should be set above a normal state voltage difference between the positive voltage source 109 and the negative voltage source 110. The negative voltage source 110, acting as a ground, allows the voltage event to dissipate whereby the internal circuitry 111 is substantially protected from a highly positive overvoltage event.

A highly negative voltage event at the signal node 107 will cause the first negative voltage PiN diode 102 to switch from reverse bias mode to a forward bias mode resulting in most of the current flowing through the first negative voltage PiN diode 102. A smaller portion of the voltage will pass through the capacitor 105 and may cause the second negative voltage PiN diode 104 to switch from reverse bias mode to a forward bias mode resulting in a significant portion of the remaining current flowing through the second negative voltage PiN diode 104. Depending upon the magnitude of the highly negative voltage event, the relative size of the negative PiN diodes 102, 104, the rise time of the highly negative voltage event, the amount of the highly negative voltage event that was shunted by the first negative voltage PiN diode 102 and other affecting criteria, the second negative voltage PiN diode 104 may or may not switch to a forward bias mode during a highly negative voltage event. The negative voltage source 110 further allows the voltage event to dissipate whereby the internal circuitry 111 is substantially protected from a highly positive overvoltage event.

Figure 2:
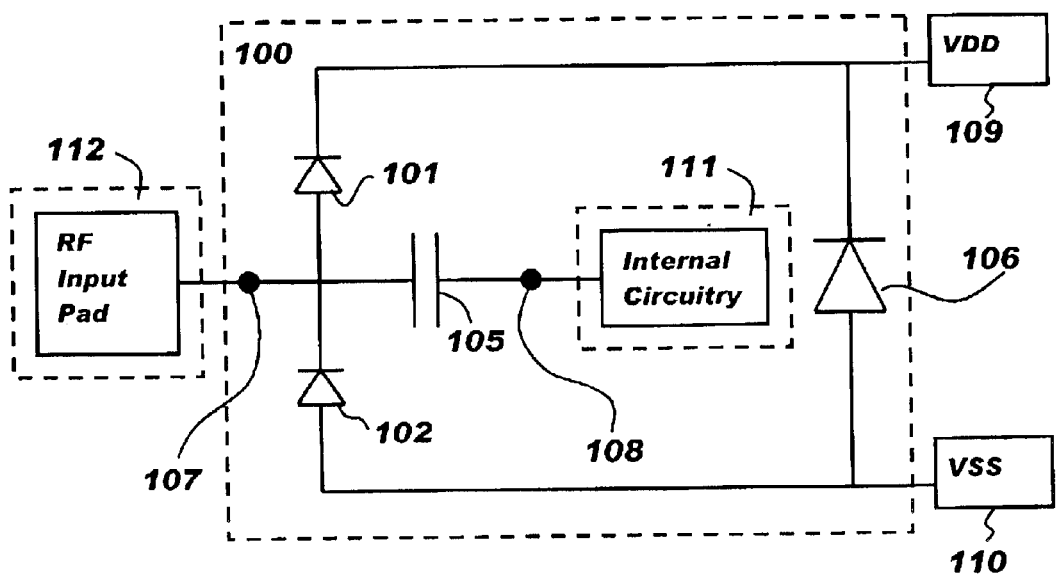
FIG. 2 is a schematic diagram of a preferred embodiment of an overvoltage protection device.

Referring now to FIG. 2 in another embodiment of the inventions, the overvoltage protection device 100 has a positive voltage PiN diode 101 and a negative voltage PiN diode 102. The capacitor 105 electrically interconnects the signal node 107 with the internal circuitry node 108. In this embodiment, the PiN diodes 101, 102 are electrically interconnected with the internal circuitry node 108 through the capacitor 105. The positive voltage PiN diode is electrically connected to the positive voltage source 109. The negative voltage PiN diode is electrically connected to the negative voltage source 110. The Zener diode 106 interconnects the positive voltage source 109 and negative voltage source 110. Within a predetermined range of voltage, the PiN diodes 101, 102 remain in a reverse bias state, substantially preventing current flow across their terminals. A highly positive voltage event will cause the positive voltage PiN diode 101 to switch from reverse bias state to forward bias state. The forward biased positive voltage PiN diode 101 will then substantially shunt the highly positive voltage event. The shunting of the highly positive voltage event will increase the voltage difference between the positive voltage source 109 and the negative voltage source 110. If that difference rises above the predetermined breakdown voltage for the Zener diode, the Zener diode will "breakdown" and further allow the voltage difference to dissipate. A highly negative voltage event will cause the negative voltage PiN diode 102 to switch from reverse bias state to forward bias state. The forward biased negative PiN diode 102 will then substantially shunt the highly negative voltage event to the negative voltage source 110.

In another embodiment, the capacitor 105 electrically interconnects the PiN diodes 101, 102 with the signal node 107. FIG. 1 and FIG. 2 are illustrative embodiments. The invention could also be implemented with a series of stacked PiN diodes or a stacked PiN diode in series with a PN junction diode. In one embodiment, PiN diode 101 would be replaced with two PiN diodes in series. The stacked PiN diodes can further reduce the capacitance of the system, however they also increase the resistance in forward bias mode. The resistance in forward bias mode is preferably kept as low as possible to aid in substantially shunting overvoltage events away from the internal circuitry node 108. In a further embodiment, additional sets of PiN diodes are arranged in parallel to further shunt the overvoltage event. It is preferable to limit the size of an overvoltage protection device for RF integrated circuits because of the relative scarcity of space on the integrated circuit. This size issue should be considered when choosing the number of PiN diodes to be integrated into the overvoltage protection device.

Figure 6:
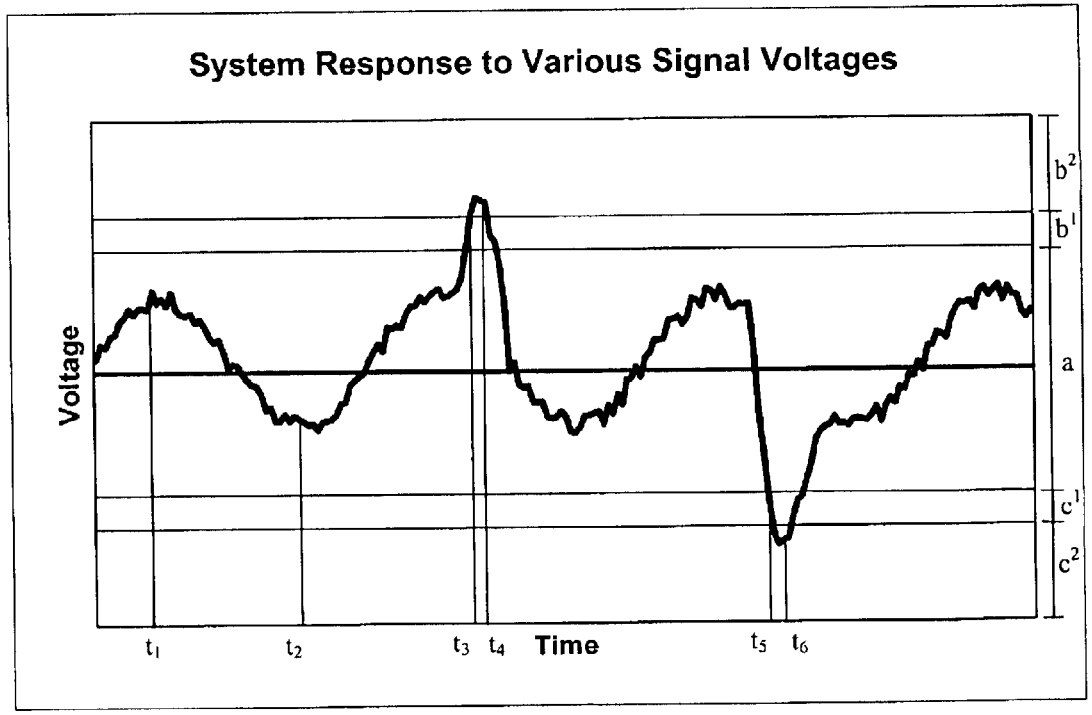
FIG. 6 is an illustrative model of system response to various signal voltages in an embodiment of an overvoltage protection device

FIG. 6 is a plot of signal voltage against the independent variable of time and serves as a simplified illustration of the operation of an embodiment of an overvoltage protection device. Within a predetermined range of voltage a, the PiN diodes will be in reverse bias mode. If the signal voltage moves above the predetermined range a to a first highly positive state $b^1$, a positive voltage PiN diode will switch to a forward bias mode. The positive voltage PiN diode will remain in forward bias mode until the voltage falls below the first highly positive state $b^1$. If the signal voltage rises above the first highly positive state $b^1$ to a second highly positive state $b^2$, the Zener diode will switch to a breakdown mode. Likewise, if the signal voltage falls below the predetermined range a to a first highly negative state $c^1$, a negative voltage PiN diode will switch to a forward bias mode. The negative voltage PiN diode will remain in forward bias mode until the signal voltage rises above the first highly negative state $c^1$. If the signal voltage falls below the first highly negative state $c^1$ to a second highly negative state $c^2$, the Zener diode will switch to a breakdown mode.

Several illustrative points along the horizontal time axis have been noted. At times $t_1$ and $t_2$, the signal voltage is within the predetermined range a and thus, the PiN diodes are in reverse bias mode. At time $t_3$, the signal voltage has risen above the predetermined range a and into the first highly positive range $b^1$. Thus, at time $t_3$, the positive PiN diode has switched to a forward bias mode. At time $t_4$, the signal voltage has risen above the first highly positive range $b^1$ and into the second highly positive range $b^2$. Thus, at time $t_4$, the positive PiN diode has switched to a forward bias mode and the Zener diode has switched to breakdown mode. At time $t_5$, the signal voltage has fallen below the predetermined range a and into the first highly negative range $c^1$. Thus, at time $t_5$, the negative PiN diode has switched to a forward bias mode. At time $t_6$, the signal voltage has fallen below the first highly negative range $c^1$ and into the second highly negative range $c^2$. Thus, at time $t_6$, the positive PiN diode has switched to a forward bias mode and the Zener diode has switched to breakdown mode.

FIG. 6 is an illustrative figure used to provide a further understanding of the principles of the operation of an embodiment. Other embodiments may have a greater or lesser number of possible system states depending upon the number, size and arrangement of the PiN diode, Zener diode and other device elements. In addition to being linked to the value of the signal voltage, the timing of the PiN diode in switching from reverse bias mode to forward bias mode is also dependent upon the signal voltage rise time, voltage at the positive voltage source, voltage at the negative voltage source and the like.

Further Description of Individual Elements

The physical structure of PiN diodes affects a forward bias resistance of the PiN diodes. Specifically, a PiN diode periphery inversely relates to the forward bias resistance. As a design parameter, forward bias resistance is preferably be kept as low as possible in order ensure substantial shunting of voltage events. Among other parameters, the PiN diode periphery also affects insertion loss and return loss associated with the overvoltage protection device. An insertion loss of greater than −0.1 dB at 800 MHz and a return loss of less than −25 dB at 6 GHz are preferred. In a preferred embodiment all the PiN diodes are manufactured with a PiN diode periphery of 50 μm.

A purpose of the capacitor 105 is to further limit the overvoltage event before it damages the internal circuitry and to bound the insertion loss and return loss associated with the overvoltage protection device by acting as a high-pass filter. In a preferred embodiment, the capacitor is a 15 pF capacitor. In accordance with these purposes, in yet another embodiment, the capacitor 105 could be replaced with a resistor, a capacitor in series with resistor, a capacitor in parallel with a resistor, a direct line that electrically connects the signal node with the internal circuitry node or the like. Other component arrangements are also possible, depending upon the desired electrical characteristics of the overvoltage protection unit. The resistor can be created via conventional CMOS or SOI methodology. For example, the resistor can be created by an implanting a resistive layer on the top silicon or through the use of a piece of polygate. One effect of the resistor would be to further limit an overvoltage event before the overvoltage event reaches the internal circuitry node.

In another embodiment, the PiN diodes do not have equal physical qualities. For example, the PiN diodes that are most closely electrically connected to the signal node may be relatively larger than the PiN diodes that are more closely electrically connected to the internal circuitry node. This difference could be appropriate because the larger PiN diodes would be able to initially shunt a majority of the overvoltage while the smaller PiN diodes would further limit the capacitance immediately near the internal circuitry node. In another embodiment of the invention, the positive voltage PiN diodes may have different physical quantities than the negative voltage PiN diodes. The difference between the positive voltage PiN diodes and the negative voltage PiN diodes could be determined based on different specifications for protection from negative and positive events. For example, a device may may be capable of withstanding a +1000 volt event or a −2000 volt event.

The Zener diode is designed to switch to a breakdown mode at a predetermined breakdown voltage difference the size of the voltage difference is known as the breakdown voltage. While in breakdown mode, the current is allowed to flow across said Zener diode. The predetermined breakdown voltage is a design parameter that should be set according to the maximum allowable voltage at the internal circuitry node and the maximum power supply rating of the positive voltage source 109. The maximum allowable voltage at the internal circuitry node is a function of the amount of voltage that the internal circuitry will tolerate. A safety factor should be included in a calculation of the maximum allowable voltage. According to a preferred embodiment said predetermined breakdown voltage should be less than approximately 6.5 volts for a maximum allowable voltage at the internal circuitry node of 8 volts.

Figure 5:
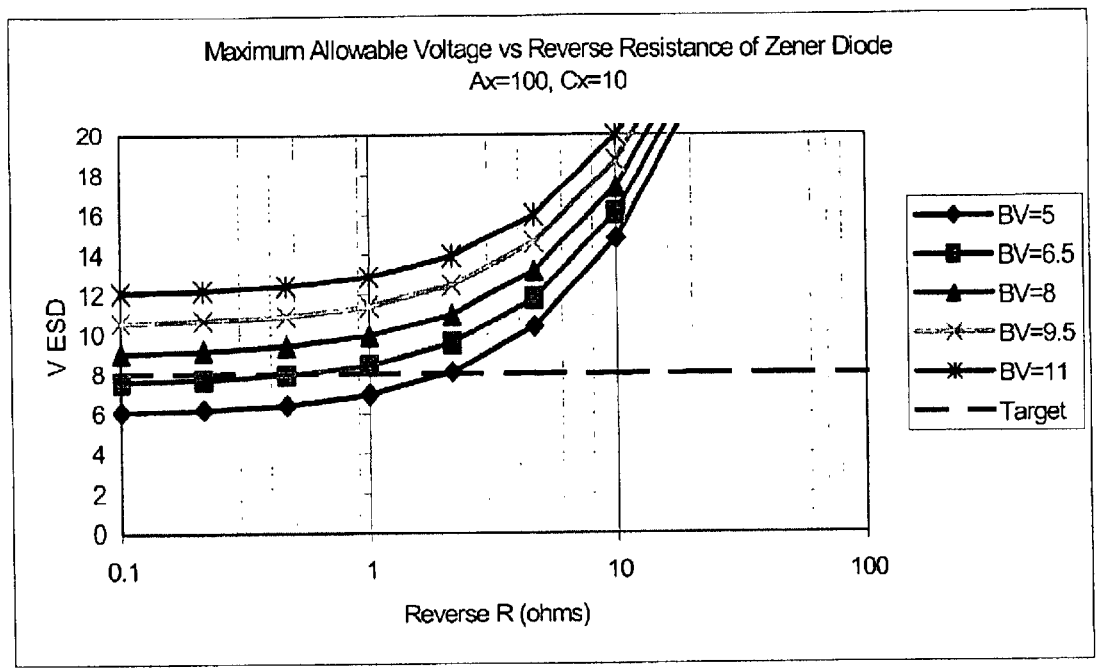
FIG. 5 is an illustrative model of the relationship between reverse resistance, breakdown voltage and maximum allowable voltage in a Zener diode for use in a preferred embodiment of an overvoltage protection device.

In breakdown mode, the Zener diode will have a reverse resistance according to the physical properties of said Zener diode. In a preferred embodiment, the breakdown resistance should be less than 1 to 2 ohms. A larger breakdown resistance would serve to lessen the further shunting of a highly positive overvoltage event from the positive voltage source to the negative voltage source. FIG. 5 shows a model used to assist in determining a range of potential values for the reverse resistance and breakdown voltage of the Zener diode. The model uses a capacitance value (Cx) of 10 pf and a diode periphery (Ax) of 100 µm. For a maximum allowable voltage of 8 V, the breakdown voltage is preferably at most 6.5 V. In addition, the reverse resistance of the Zener diode is preferably less than 1 ohm.

The Zener diode represents a preferred embodiment of the invention. As alternatives to said Zener diode, the overvoltage protection device could utilize a Zener diode in series with a PN junction diode, a PN junction diode, a Zener diode in series with a PiN diode, a TVS diode or other switching or breakdown devices to further shunt a highly positive overvoltage event from the positive voltage source to the negative voltage source. A breakdown device as part of the overvoltage protection device is not necessary in all circumstances. For example, some positive voltage sources may be able to act to dissipate a highly positive voltage event without the need to further shunt said highly positive voltage event to a negative voltage source. In another embodiment, a switching device for further shunting highly positive voltage events from the positive voltage source to the negative voltage source is part of the integrated circuit rather than part of the overvoltage protection device.

PiN Diode Fabrication

Figure 3:
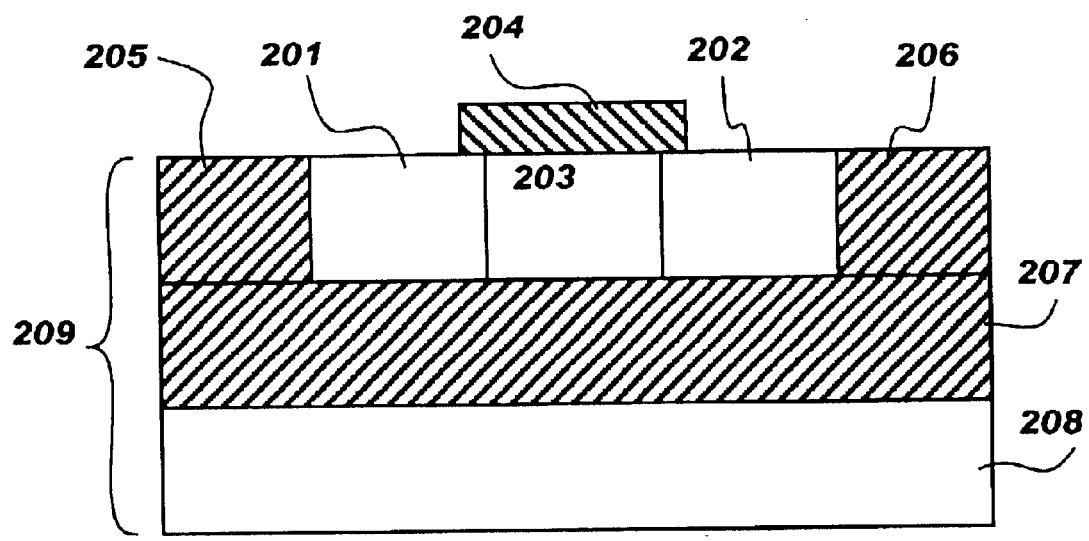
FIG. 3 is a cross-sectional view of a PiN diode for use in another embodiment of an overvoltage protection device.

Referring now to FIG. 3, in a preferred embodiment of the present invention, a cross-sectional view of a PiN diode. The PiN diode is formed on a high-resistivity silicon-on-insulator (SOI) wafer 209. Use of the SOI wafer 209 allows the PiN diode to be put into practice using the same steps used for CMOS transistors, resulting in no additional manufacturing costs. The SOI wafer 209 has a buried oxide layer 207 built into the silicon substrate immediately beneath a top silicon layer. The buried oxide layer 207 essentially insulates the top silicon layer from the remaining substrate 208. The starting SOI wafer 209 has a resistivity of approximately 1000 to 2000 ohm-cm P type. The top silicon layer is approximately 150 nm to 250 nm thick, and the buried oxide is approximately 200 nm to 400 nm thick.

A preferred method of fabricating a PiN diode is described next. Isolation regions 205, 206 are formed in the top silicon layer by using local oxidation of silicon (LOCOS). Other isolation methods such as trench isolation could be used. A spacer oxide 204 of thickness from 150 nm to 250 nm is deposited and patterned to cover a center portion of the top silicon. The space oxide 204 should leave exposed regions at either end of the top silicon, which will subsequently form the P region 201 and N region 202 of the PiN diode. The length of the spacer oxide defines the size of the i region 203 of the PiN diode. The size of the i region is approximately 700 nm.

A P region 201 is formed by defining a P+ implant photoresist mask and implanting boron to a doping level of approximately $1 \times 10^{20}$ atoms/cm$^2$ to $5 \times 10^{20}$ atoms/cm$^2$. A N region 202 is formed by defining a N+ implant photoresist mask and implanting arsenic to a doping level of $1 \times 10^{20}$ atoms/cm$^2$ to $5 \times 10^{20}$ atoms/cm$^2$. The i region 203 is defined as the undoped region between the P region 201 and the N region 202.

Figure 4:
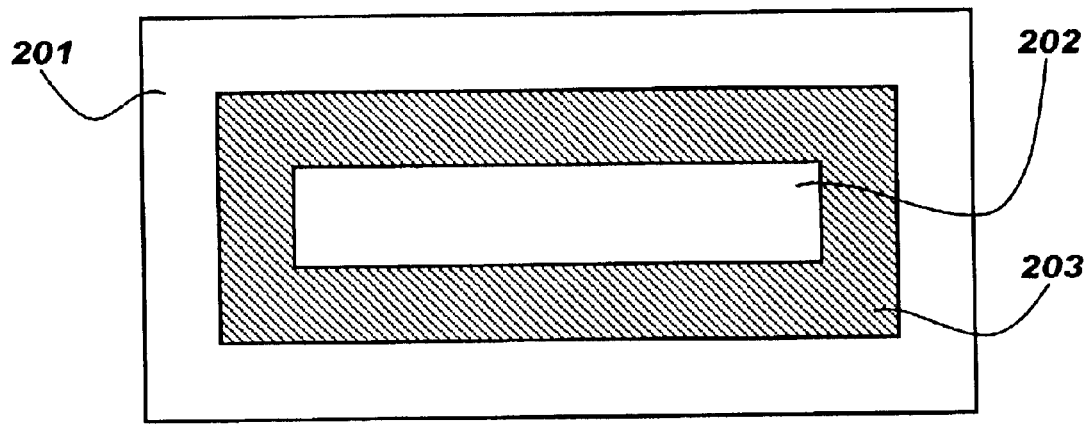
FIG. 4 is a top view of a PiN diode for use in a preferred embodiment of an overvoltage protection device.

FIG. 4 shows a top view of the PiN diode in a preferred embodiment of the invention. The P region 201 is separated from the N region 202 by the i region 203.

In one embodiment, the overvoltage protection device has a capacitance of approximatedly 0.2 fF per micron. Thus, an overvoltage protection device with four PiN diodes, each 50 microns, would exhibit a capacitance of approximately 40 fF. This low capacitance has the desired effect of minimizing signal attenuation and signal degradation and of maintaining an adequate signal to noise ratio. In addition to low capacitance, an added benefit of an embodiment of the overvoltage protection device is that it can be produced on the same wafer as the integrated circuit to be protected at no additional manufacture cost.

What is claimed is:

1. An overvoltage protection device comprising:
   a signal node for receiving and conveying a signal voltage;
   an internal circuitry node for further conveying said signal voltage, said internal circuitry node being electrically interconnected to said signal node;
   a positive voltage PiN diode electrically connected to said signal node and to a positive voltage source whereby said positive voltage PiN diode has its forward direction from said signal node to said positive voltage source wherein said positive voltage PiN diode is in a reverse bias mode when a voltage at said signal node is within a predetermined voltage range, and wherein said positive voltage PiN diode is in a forward bias mode when a voltage present at said signal node is above said predetermined voltage range, and wherein said positive voltage PiN diode, while in said reverse bias mode, exhibits a reverse bias capacitance in the range of 10 to 20 fF. and a negative voltage PiN diode electrically connected to said signal node and to a negative voltage source whereby said negative voltage PiN diode has its forward direction from said negative voltage source to said signal node wherein said negative voltage PiN diode is in a reverse bias mode when a voltage at said signal is within a predetermined voltage range, and wherein said negative voltage PiN diode is in a forward bias mode when a voltage present at said signal node is below said predetermined voltage range, and wherein said positive voltage PiN diode, while in said reverse bias mode, exhibits a reverse bias capacitance in the range of 10 to 20 fF; and
   a limiting circuit element electrically connected in series between the signal node and the internal circuitry node for further weakening a voltage spike.

2. The overvoltage protection device of claim 1 wherein said overvoltage protection device is incorporated into an integrated circuit.

3. The overvoltage protection device of claim 2 wherein the integrated circuit is fabricated on a high-resistivity silicon on insulator (SOI) wafer.

4. The overvoltage protection device of claim 1 further comprising:
   a breakdown device electrically connected between the positive supply voltage and the negative supply voltage wherein the breakdown device provides an additional shunt current path.

5. The overvoltage protection device of claim 1 wherein the breakdown device comprises an element selected from the group consisting of Zener diode, Zener diode in series with PN junction diode, Zener diode in series with PiN diode, and TVS diode.

6. The overvoltage protection device of claim 1 wherein the limiting circuit element is selected from the group consisting of capacitor, resistor, capacitor in series with resistor, and capacitor in parallel with resistor.

7. An electrostatic discharge (ESD) protection circuit fabricated as part of an SOI integrated circuit comprising:
- a signal node for receiving and conveying a signal voltage;
- a sink node;
- at least one PiN diode for shunting voltage events away from the signal node to the sink node whereby said at least one PiN diode is in a reverse bias mode when a voltage at said signal node is within a predetermined range, and wherein said at least one PiN diode is in a forward bias mode when a voltage at said signal node is outside said predetermined range, and wherein a reverse bias capacitance of said at least one PiN diode while in said reverse bias mode is less than 20 fF per PiN device.

8. The ESD protection circuit fabricated as part of an SOI integrated circuit of claim 7 further comprising a breakdown device electrically connected between said at least one PiN diode and said sink node wherein said breakdown device provides an additional shunt current path for an ESD event.

9. The ESD protection circuit fabricated as part of an SOI integrated circuit of claim 8 wherein the breakdown device comprises an element selected from the group consisting of Zener diode, Zener diode in series with PN junction diode, Zener diode in series with PiN diode, and TVS diode.

10. An overvoltage protection device comprising:
- a signal node for receiving and conveying a signal voltage;
- an internal circuitry node for further conveying said signal voltage, said internal circuitry node being electrically interconnected to said signal node;
- a positive voltage source;
- a negative voltage source;
- a first PiN diode electrically connected to said signal node and to said positive voltage source whereby said first PiN diode has its forward direction from said signal node to said positive voltage source;
- a second PiN diode electrically connected to said signal node and to said negative voltage source whereby said second PiN diode has its forward direction from said negative voltage source to said signal node;
- a third PiN diode electrically connected to said internal circuitry node and to said positive voltage source whereby said third PiN diode has its forward direction from said is internal circuitry node to said positive voltage source;
- a fourth PiN diode electrically connected to said internal circuitry node and said negative voltage source whereby said fourth PiN diode has its forward direction from said negative voltage source to said signal node; and
- a capacitor electrically connected in series between said signal node and said internal circuitry node whereby an electric surge at the signal node is substantially shunted away from the internal circuitry node through at least one of the PiN diodes.

11. The overvoltage protection device of claim 10 further comprising a breakdown device electrically connected between the positive voltage source and the negative voltage source.

12. The overvoltage protection device of claim 11 wherein the breakdown device comprises an element selected from the group consisting of Zener diode, Zener diode in series with PN diode, Zener diode in series with PiN diode, and TVS diode.

13. The overvoltage protection device of claim 12 wherein the capacitor has a capacitance of approximately 15 pF.

14. The overvoltage protection device of claim 10 wherein each PiN diode has a PiN diode periphery of approximately 50 $\mu$m.

15. The overvoltage protection device of claim 10 wherein each PiN diode has a capicatance of approximately 0.2 fF per micron of diode periphery.

16. The overvoltage protection device of claim 10 wherein the capacitor has a capacitance of approximately 15 pF.

17. The overvoltage protection device of claim 10 wherein the first PiN diode is larger than the third PiN diode and the second PiN diode is larger than the fourth PiN diode.

18. The overvoltage protection device of claim 10 further comprising a semiconductor substrate that serves as a base of the overvoltage protection device, wherein the semiconductor substrate is a high-resistivity silicon on insulator (SOI) semiconductor substrate.

19. The overvoltage protection device of claim 18, wherein the high-resistivity silicon on insulator (SOI) semiconductor substrate includes a buried oxide layer and a top silicon layer, wherein the buried oxide layer substantially insulates the top silicon layer from the remaining substrate, and
- a wherein the top silicon layer is approximately 150 nm to 250 nm thick, and wherein the buried oxide layer is approximately 200 nm to 400 nm thick.

20. An electrostatic discharge (ESD) protection circuit fabricated as part of an SOI integrated circuit comprising:
- a signal node for receiving and conveying a signal voltage;
- a sink node; and
- at least two pair of PiN diodes for shunting voltage events away from the signal node to the sink node whereby each PiN diode is in a reverse bias mode when a voltage at said signal node is within a predetermined range, and wherein one PiN diode of each pair is in a forward bias mode when a voltage at said signal node is outside said predetermined range.

* * * * *